US007045467B2

(12) United States Patent
Yew

(10) Patent No.: US 7,045,467 B2
(45) Date of Patent: May 16, 2006

(54) METHOD FOR DETERMINING ENDPOINT OF ETCH LAYER AND ETCHING PROCESS IMPLEMENTING SAID METHOD IN SEMICONDUCTOR ELEMENT FABRICATION

(75) Inventor: Huong Chung Yew, Sibu (MY)

(73) Assignee: 1st Silicon(Malaysia) Sdn Bnd (MY)

( * ) Notice: Subject to any disclaimer, the term of this patent is extended or adjusted under 35 U.S.C. 154(b) by 216 days.

(21) Appl. No.: 10/607,942

(22) Filed: Jun. 27, 2003

(65) Prior Publication Data
US 2004/0266198 A1    Dec. 30, 2004

(51) Int. Cl.
*H01L 21/302* (2006.01)
(52) U.S. Cl. .......................... 438/714; 438/5; 438/706; 438/710
(58) Field of Classification Search .............. 438/5, 438/7, 8, 9, 14, 706, 710, 712, 715
See application file for complete search history.

(56) References Cited
U.S. PATENT DOCUMENTS
6,009,888 A    1/2000 Ye et al.

6,277,716 B1 *   8/2001  Chhagan et al. ............ 438/584
6,368,975 B1     4/2002  Balasubramhanya et al.
2003/0043383 A1  3/2003  Usui et al.

\* cited by examiner

*Primary Examiner*—Lan Vinh
(74) *Attorney, Agent, or Firm*—Lawrence Y. D. Ho & Assoc.

(57)    ABSTRACT

A method of determining the endpoint of an etch layer in a semiconductor element fabrication, wherein said element is comprised of at least a first material layer, a second material layer on said first material layer, said endpoint determining method comprises the steps of (i) determining the total emission intensity wavelength of the first material layer; (ii) determining the total emission intensity wavelength of the second material layer; (iii) plotting the scalar of the wavelength differential of the upper and lower layers; and (iv) choosing the highest peak of wavelength differential as the best range of endpoint detection wavelength.

This method is particularly useful for etching stacks where the first and second material layers have endpoint emission wavelengths that are close to each other. This include nitrogen-rich silicon layer which is overlaid by an antireflective coating (ARC) layer, e.g. silicon nitride, $Si_3N_4$ overlaid by bottom antireflective coating (BARC).

5 Claims, 5 Drawing Sheets

METHOD FOR DETERMINING ENDPOINT OF ETCH LAYER AND ETCHING PROCESS IMPLEMENTING SAID METHOD IN SEMICONDUCTOR ELEMENT FABRICATION

TECHNICAL FIELD

This invention relates to a method for determining the end of etching of a layer in semiconductor element fabrication. Specifically, it relates to endpoint wavelength detection method of the etch completion an overlay layer whereby said layer and the underlying layer may have similar endpoint emission wavelengths. An etching process implementing such method is also disclosed.

BACKGROUND ART

Due to the increase miniaturisation of semiconductor elements to be fabricated so as to make smaller structures and in increasing densities, challenges are ever present in this field of technology. Photolithography of patterns that are increasingly smaller and denser on a polysilicon layer that has a relatively high reflectivity pose the problem of forming patterns wherein certain microfine features might be broadened or narrowed as a result of the undesirable high reflection due to the presence of metals such as aluminium, tungsten and copper.

Therefore, it is often necessary to provide an anti-reflective coating (ARC) to allow a better imaging of an patterning layer. In particular, an overlying layer comprising a bottom anti-reflective coating (BARC) may be formed over the underlying polysilicon layer to reduce the reflection of light during photolithographic patterning process. As shown in FIG. 1, the photoresist (PR) is then formed as a negative of the pattern to protectively cover those areas not to be etched.

The exposed overlying layer may then be etched with a recipe known for selectivity to said layer, in this case BARC, to expose the underlying layer, in this case SiN, not covered by the photoresist. The SiN layer may then be etched to form the pattern on the silicon substrate. The etching rate and depth of etch reached may be monitored by endpoint detection (EPD) systems. The etch endpoint is identified by monitoring the magnitude or intensity of an optical emission. Endpoint detection may be conducted with an optical emission spectroscopy (OES) system to detect when an upper layer (e.g. a dielectric layer), which is being etched, has been penetrated to reach the underlying layer (e.g. a polysilicon layer). Upon the etch reaching the underlying layer, the underlying material that is released into the chamber atmosphere has a signature wavelength that may be detected by the endpoint detection system.

Materials chosen as BARC depends on the wavelength used for the photo-masking process but typically include titanium nitride, silicon oxynitride ($SiO_xN_y$), silicon nitride, silicon dioxide and organic ARC materials. BARC on SiN (hereinafter "BARC/SiN") stacks is unfortunately very common nowadays, especially for the process that called in situ trench etch because both BARC and SiN when etched releases very similar by-products or residues into the chamber atmosphere and the conventional EPD systems could not detect accurately and efficiently whether BARC is being etched or it has been completely etched and has reached the SiN layer.

This poses a problem for EPD systems using optical emission spectroscopy (OES) for all layers comprising material A overlying material B where A and B have similar or very similar endpoint wavelengths to be detected. This is because the by-products of material B released would have similar endpoint wavelength as that of material A.

U.S. Pat. No. 6,009,888 (Ye, et. al., granted to Chartered Semiconductor) disclosed the successful etching, among others, of layers of photoresist, BARC and polymer over silicon nitride after a dry etch using a combination of acid ($S_2O_8^{2-}$/HCl/$H_2O$) bath and simultaneous UV laser irradiation to achieve an etching synergy (compares to separate bath and irradiation) without relying on endpoint detection means.

U.S. Pat. No. 6,277,716 (Chhagan, et. al., also granted to Chartered Semiconductor) includes an example which comprises layers of photoresist, BARC and nitrogen rich silicon (e.g. SiN) which includes an additional layer for endpoint detection purposes. The endpoint detect layer is formed of a nitride rich polysilicon layer and formed by depositing polysilicon in an ammonia ambient in a low pressure chemical vapour deposition (LPCVD) process. Accordingly, this requires separate and additional etch steps in the process to remove the endpoint etch layer and the BARC prior to pattern etching.

U.S. Pat. No. 6,368,975 (Balasubramhanya, et. al.; granted to Applied Materials, Inc.) discloses a method for measuring or monitoring correlated attributes of a process (e.g. electromagnetic emissions of plasma) and using Principal Component Analysis (PCA) to analyse the correlated attributes so that process event information may be obtained, including endpoint detection or "breakthrough" etching. Amidst the breath of scope and methodological sophistication, the time element or factor, e.g. the timing of an endpoint, remains a critical element of the method. There is no attempt to differentiate the closely similar endpoint wavelengths of the overlying and underlying materials.

US-2003/0043383 (Usui, et. al.) disclosed a methodology for determining endpoint which requires simultaneous multiple wavelengths to produce interference light waveforms so that, based on the time-differential waveforms, the patterns representing wavelength dependencies of the interference waveform differential values, the film thickness may be measured. Apart from having to rely on interference of light, the analysis of differential values is also time-based.

OBJECTS OF INVENTION

The present invention endeavours to provide for a method for determining the etch endpoint of a first layer coated over a second layer wherein both layers each has etch endpoint wavelengths that is similar or close to each other.

The invention employs conventional endpoint detection means including optical emission spectroscopy (OES), which means existing apparatus of semiconductor processes may continue to be used without the need for modification or investing in new apparatuses.

Another object is to provide for a single recipe for etching both the first and second material layers, each of which having etch endpoint wavelengths similar to each other, including BARC and SiN layers, thus rendering resources and process control simplified in implementing the method and process of the invention.

Yet another object is to avoid having additional or multiple etch steps in removing the first and second layers as multiple etch steps would place a burden on the system throughput.

A further object is to avoid complicated analysis or mathematical method required to determine the etch endpoint wavelengths of the different material layers and the differential thereinbetween.

STATEMENT OF DISCLOSURE

To achieve the aforesaid objects, it is therefore proposed herein a general embodiment comprising a method of determining the endpoint of an etch layer in a semiconductor element fabrication, wherein said element is comprised of at least a first material layer, a second material layer on said first material layer, said endpoint determining method comprises the steps of (i) determining the total emission intensity wavelength of the first material layer; (ii) determining the total emission intensity wavelength of the second material layer; (iii) plotting the scalar of the wavelength differential of the upper and lower layers; and (iv) choosing the highest peak of wavelength differential as the best range of endpoint detection wavelength.

This method is particularly useful for stacks where the first and second material layers have endpoint emission wavelengths that are close to each other. This include nitrogen-rich silicon layer which is overlaid by an antireflective coating (ARC) layer, e.g. silicon nitride, $Si_3N_4$ overlaid by bottom antireflective coating (BARC), including organic and inorganic BARC materials.

In one aspect of the invention, a recipe effective in etching the second material layer is used for etching in both of steps (i) and (ii) above. The recipe includes a plasma-etching environment having low source power, low bias power, low pressure and etch chemistries including $Cl_2$ and $O_2$. The plasma may preferably be a decoupled plasma source (DPS) having a pressure at about 0.8 Pa (6 mTorr), bias power at about 55 W, source power at about 350 W, $Cl_2$ flow rate at about 47 sccm and $O_2$ flow rate of 47 sccm.

In another aspect of the invention, the endpoint wavelength detection steps employ optical endpoint detection means, including a plasma-etch optical emission-sensing and control means for use with a DPS chamber. The endpoint system may be enabled to define etch-endpoint algorithms for each wafer to be etched, control the point at which etching stops, and store the endpoint data for each etched wafer, and whereby said endpoint data trace is retrievable for any etch operation.

In another embodiment of the invention, the method may be implemented in a process for etching an upper layer from a lower layer in the fabrication of a semiconductor element, comprising the steps of determining the total emission intensity wavelength of the upper layer; (ii) determining the total emission intensity wavelength of the lower layer; (iii) plotting the scalar of the wavelength differential of the upper and lower layers; (iv) choosing the highest peak of the differential graph as the best range of endpoint detection wavelength; (v) etch said upper layer using the wavelength chosen according to step (iv) as endpoint detection. The process may include etching of a patterned wafer.

In one aspect of the embodiment, at least one of steps (i) to (iv) may have been predetermined and the data retrievably stored so that etching step (v) may be conducted upon determining the endpoint detection wavelength using such predetermined data.

In a specific embodiment of the process, the etching is conducted in an environment comprising a source power of about 250–450 W, a bias power of about 40–70 W, a pressure of about 0.53–1.1 Pa (4–8 mTorr) and a ratio of $Cl_2$ flow to $O_2$ flow of about 0.75–1.25.

Preferably, the endpoint wavelength detection steps employ optical endpoint detection means which includes a plasma-etch optical emission-sensing and control device for use with a DPS chamber. Preferably still, the endpoint system is enabled to define etch-endpoint algorithms for each wafer to be etched, control the point at which etching stops, store the endpoint data for each etched wafer, and wherein such endpoint data trace is retrievable for any etch operation.

In another aspect of the invention, the process may be implemented such that step (i) is conducted in a first etching chamber, including a DPS chamber, provided with online data transmission and control signal; step (ii) is conducted in a second etching chamber, including a DPS chamber, provided with online data transmission and control signal; and at least a processor, memory and optionally data storage means are provided in a suitable arrangement to perform steps (iii) and (iv) with the inputs from the first and second etching chambers. Preferably, step (v) is conducted in a third etching chamber, including a DPS chamber, upon determining the best wavelength in step (c) as endpoint detection.

In another embodiment of the process, the etching of a pattern on an underlying layer atop a silicon substrate in the fabrication of a semiconductor element may comprise of (i) coating an overlying layer atop said underlying layer; (ii) forming a negative image of said pattern atop said overlying layer by protecting areas thereon which is not to be etched; (iii) etch the exposed areas of said overlying layer according to data obtained from a method of claim 1; and (iv) etch the exposed areas of said underlying layer to form said pattern on said silicon substrate.

In yet another embodiment, the process for etching a pattern on an underlying layer in the fabrication of a semiconductor element comprises of (i) coating an overlying layer atop said underlying layer; (ii) forming a negative image of said pattern atop said overlying layer by protecting areas thereon which is not to be etched; (iii) etch the exposed areas of said overlying layer with a process according to the present invention; and (iv) etch the exposed areas of said underlying layer to form said pattern on said silicon substrate.

LIST OF ACCOMPANYING DRAWINGS

The method and process of the present invention may be better understood by referring to the following drawings as specific embodiments, which are not to be construed as the sole embodiment or delimiting the scope of the invention thereto, in which FIG. 1 is a schematic profile elevation of layers of a patterned semiconductor element;

DETAILED DESCRIPTION OF SPECIFIC EMBODIMENTS

Besides the optical endpoint detector system, such as the optical emission spectroscope mentioned above, an etching chamber is also required for carrying out the invention. A suitable etching chamber for implementing the method and process of the present invention is a Decoupled Plasma Source (DPS) chamber.

A DPS chamber allows independent control of the source power (which generates the plasma), and the bias power. Such chambers also enable low process pressures at high process gas flows be maintained. The optical endpoint system detector and lamp may be optically connected in the DPS chamber by a rigid quartz pipe to avoid contact with the RF coils. One such etching chamber is the Centura® DPS™ chamber available from Applied Materials, Inc. of Santa Clara, U.S.A.

The first step of the method of the present invention entails determining the total emission intensity of the first material, or $I_{material}$; in this case BARC, i.e. $I_{BARC}$.

A recipe typically for etching the overlying layer, in this example, the BARC layer, may be used. The etching conditions for the BARC layer as shown in the following TABLE I will show the suitability of a DPS chamber:

TABLE I

Recipe for BARC etching

| | |
|---|---|
| Pressure | 0.8 Pa (6 mTorr) |
| Bias power | 55 W |
| Source power | 350 W |
| Chlorine, $Cl_2$, flow rate | 47 sccm |
| Oxygen, $O_2$, flow rate | 47 sccm |

In particular, the DPS etch chamber is able to provide the requisite conditions, i.e. low source power, low bias power, low pressure and accommodate etch chemistries which include $Cl_2$ and $O_2$. Generally, the etch recipe may comprise of a source power of about 250–450 W, a bias power of about 40–70 W, a pressure of about 0.53–1.1 kPa (4–8 mTorr) and a ratio of $Cl_2$ flow to $O_2$ flow of about 0.75–1.25.

Figure 2:
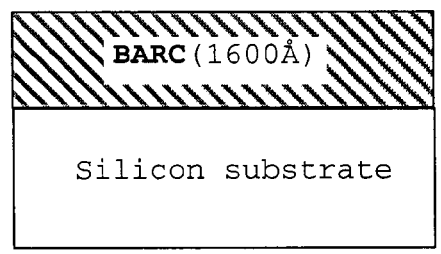
FIG. 2 is a schematic profile elevation of a blank wafer showing a layer of BARC coating on silicon substrate.

BARC layer calibrating etch. A blank wafer coated with a 1600 Å thick layer of BARC as shown in FIG. 2 is etched with the recipe of TABLE I for 30 seconds. During the etch, the EPD system is switched on to detect the total emission intensity of BARC, $I_{BARC}$, from a preset starting wavelength of 2000 Å to the preset ending wavelength of 5000 Å by a stepping value of 5 Å.

Figure 3:
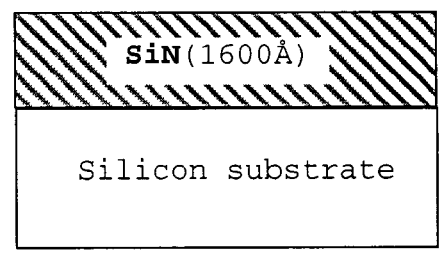
FIG. 3 is a schematic profile elevation of a blank water showing a layer of SiN coating on silicon substrate.

SiN layer calibrating etch. Next, a blank wafer coated with a 1600 Å thick layer of SiN as shown in FIG. 3 is etched with the same recipe of TABLE I for 30 seconds. During the etch, the EPD system is switched on to detect the total emission intensity of SiN, $I_{SiN}$, in the same manner as in the BARC layer calibration.

It may be noted that the thickness of 1600 Å of both the first and second material layers need not be the same. The thickness of the subject layers on the blank wafers only need to be sufficiently thick to be etched for the duration of the wavelength range to be covered in order for the EPD system to record the emission spectrum. In this case, the subject coating should last about 30 seconds for the wavelength range from 2000 Å to 5000 Å by a stepping value of 5Å. are also dependent on the resolution required of the emission spectrum.

The results may be tabulated in a electronic worksheet in the following manner in TABLE II where the differential between $I_{BARC}$ and $I_{SiN}$ in scalar magnitude may be worked out automatically.

TABLE II

Results of $|I_{BARC} - I_{SiN}|$

| λ, wavelength (Å) | $I_{BARC}$ | $I_{SiN}$ | δ, differential $|I_{BARC} - I_{SiN}|$ |
|---|---|---|---|
| 2000 | 23436 | 27712 | 4276 |
| 2005 | 22384 | 25432 | 3048 |
| 2010 | 20568 | 23820 | 3252 |
| 2015 | 17116 | 20612 | 3496 |
| 2020 | 15436 | 16980 | 1544 |
| 2025 | 13056 | 14256 | 1200 |
| 2030 | 11292 | 12428 | 1136 |
| 2035 | 9472 | 10320 | 848 |
| 2040 | 8220 | 8548 | 328 |
| 2045 | 7544 | 7472 | 72 |
| 2050 | 7232 | 7040 | 192 |
| . | . | . | . |
| . | . | . | . |
| . | . | . | . |
| 4970 | 33684 | 31672 | 2012 |
| 4975 | 35032 | 32504 | 2528 |
| 4980 | 36568 | 33856 | 2712 |
| 4985 | 37804 | 35064 | 2740 |
| 4990 | 37300 | 35032 | 2268 |
| 4995 | 36580 | 34244 | 2336 |

Figure 4:
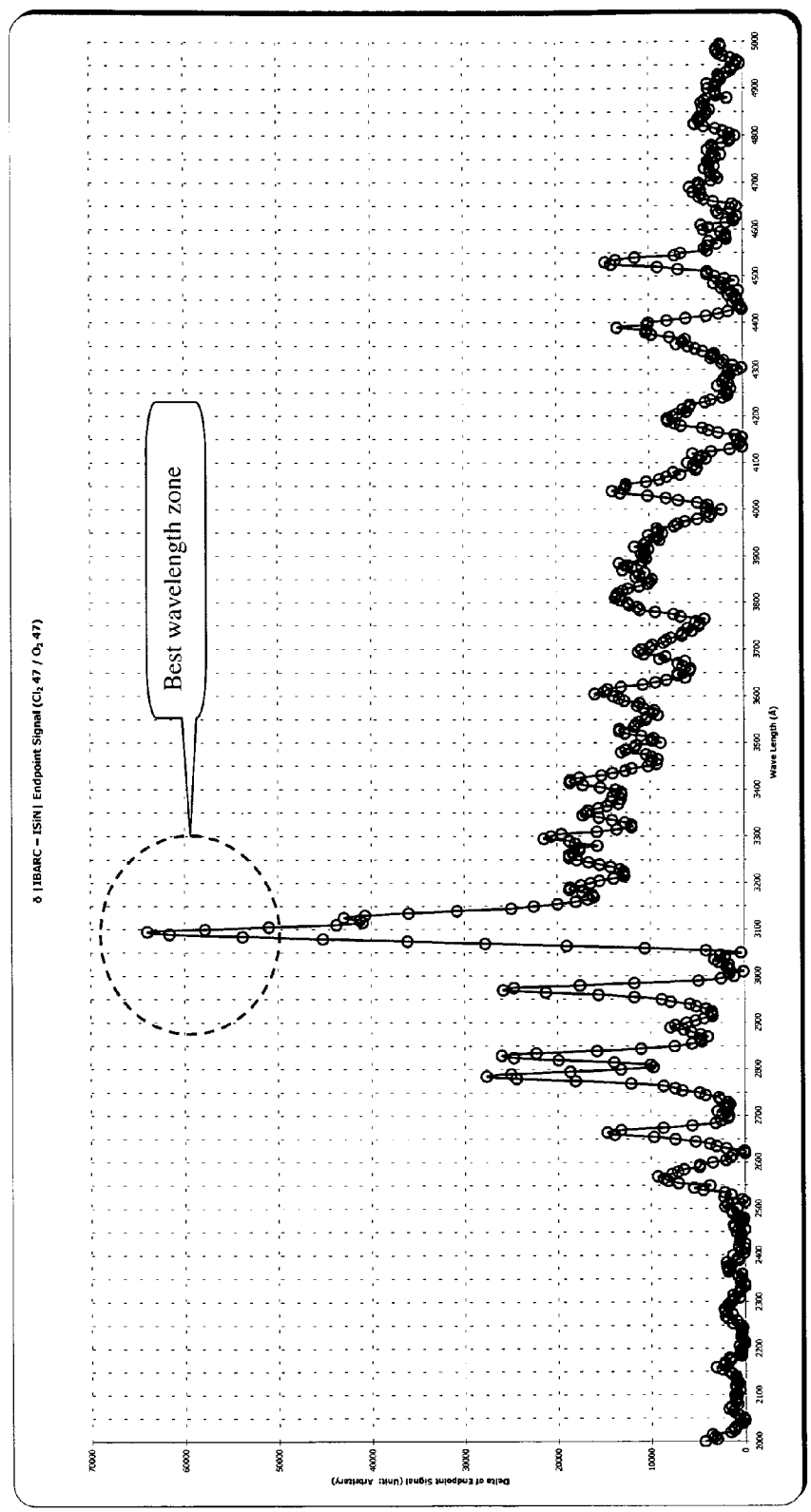
FIG. 4 is a graph of the scalar of total intensity emission wavelength differential between two materials versus wavelength (arbitrary)

The results of the last or $4^{th}$ column of TABLE II, δ, i.e. the scalar of the differential between the total emission intensities of BARC and SiN or $|I_{BARC} - I_{SiN}|$ is then plotted so that the highest value may be graphically and easily discerned in shown in FIG. 4. A graph is plotted in which the Y-axis is the absolute value of $|I_{BARC} - I_{SiN}|$ while the X-axis is the endpoint detection wavelength from 2000 to 5000 Å by a stepping value of 5 Å.

From the graph, it may be seen that the highest differential could be detected at 3095 Å, or within a range from 3075 to 3135 Å for the particular recipe (see TABLE I) and film stack (BARC/SiN) as described hereinbefore.

It may be noted that the largest endpoint detection wavelength differential may be obtained by other mathematical methods, particularly algorithms that would amplify the differential so that the largest differential may be obtained. The scalar of the differential or $|I_{BARC} - I_{SiN}|$ is shown here as the most simple method.

It may not be necessary to plot a graph to visually present the peaks and the highest peak indicating the best range of wavelength differential. Electronic means such as worksheet software may be used to quickly pinpoint the highest peak or best range from the sets of total emission intensities of the two materials obtained without plotting a graph first.

Figure 1:
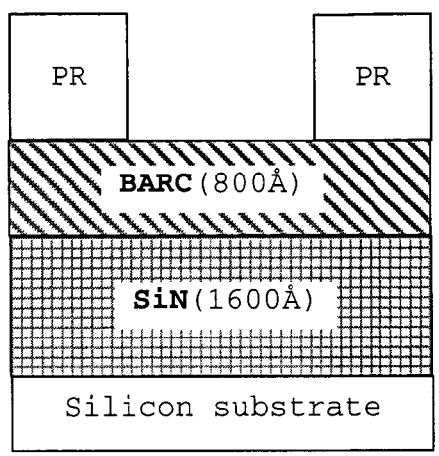

To verify the effectiveness of the method of the present invention, three patterned wafers as described in FIG. 1 above are prepared and three different wavelengths are chosen from the graph of FIG. 4 comprising the highest peak (i.e. the best wavelength) at 3095 Å as well as two other wavelengths which are known to be the typical endpoint wavelengths for BARC/polysilicon and BARC/SiN film stacks, i.e. 4835 Å and 3865 Å respectively.

Figure 5:
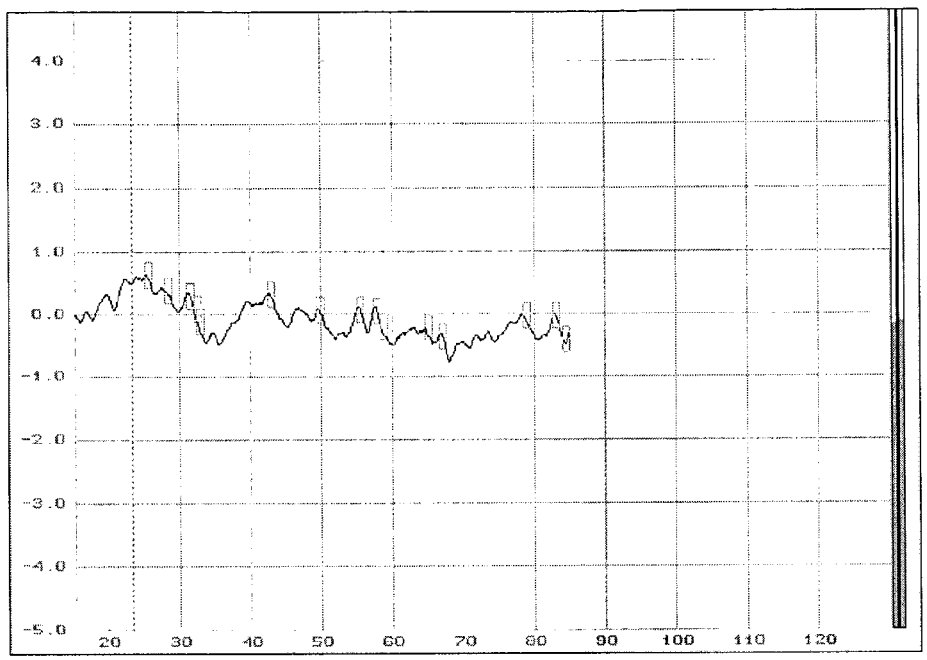
FIG. 5 is a graph plotting the EPD for BARC over polysilicon at 4835 Å.
Figure 6:
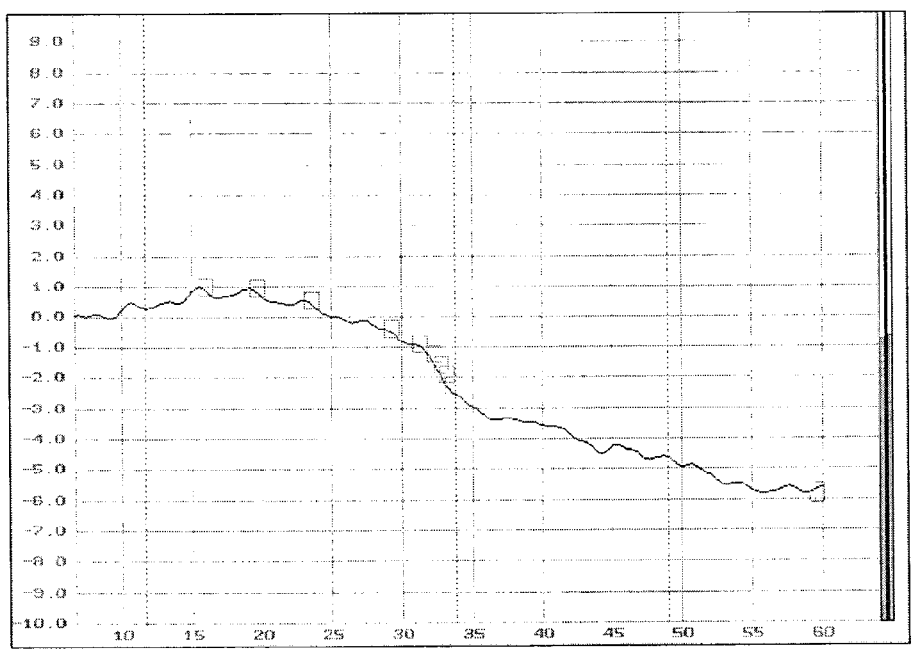
FIG. 6 is a graph plotting the EPD for BARC over silicon nitride at 3865 Å.

The EPD graphs for BARC/polysilicon at 4835 Å and BARC/SiN at 3865 Å are illustrated in FIG. 5 and FIG. 6 wherein it is apparent that the listless decline of the graphs are unable to pinpoint the etch endpoints. In FIG. 6 a general decline is noticeable however, the range of the decline is too long and gradual to be effective in pinpointing an etch endpoint.

Figure 7:
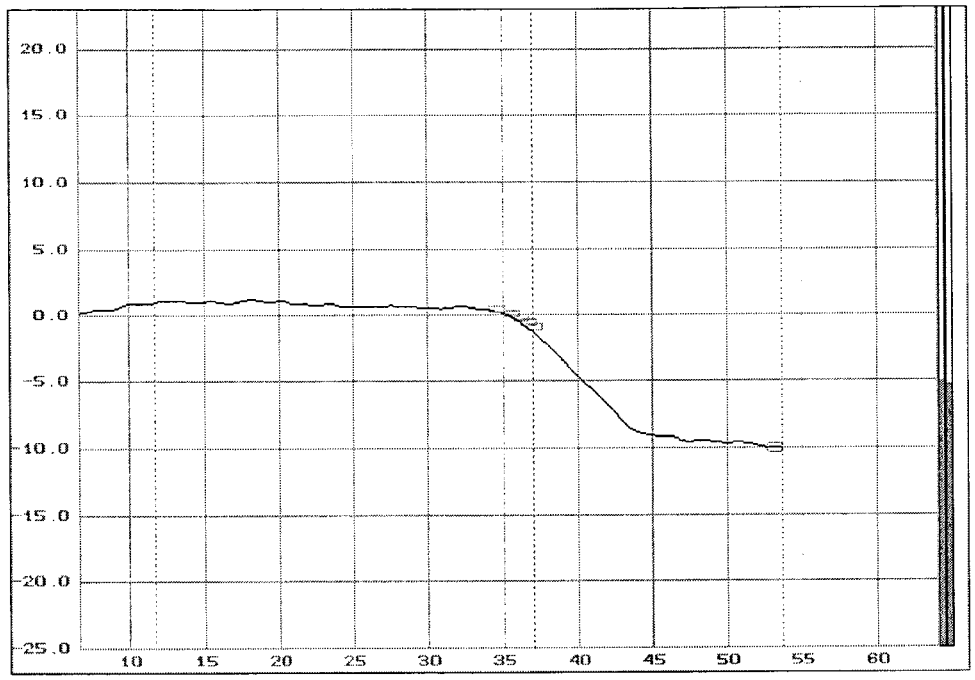
FIG. 7 is a graph plotting the EPD for BARC over silicon nitride at 3095 Å.

The EPD graph for BARC/SiN at 3095 Å as shown in FIG. 7 is relatively a smoother curve and shows a sharp decline upon detecting the etch endpoint. Thus, this best wavelength range also gives a higher signal magnitude upon detecting the etch endpoint.

Accordingly, the present method's differential of endpoint emission wavelengths may be applied to accurately determine the endpoint etching of two layers of films having endpoint emission wavelengths that is close to each other although the embodiment shown here is a BARC layer overlying a silicon nitride layer.

The present embodiment also shows that the same recipe as detailed in Table I above may be used effectively in both the calibration etch of blank wafers as well as in etching the patterned wafer.

The best range EDP wavelength of 3095 Å is further tested on BARC/SiN wafers of different conditions as follows.

Figure 8:
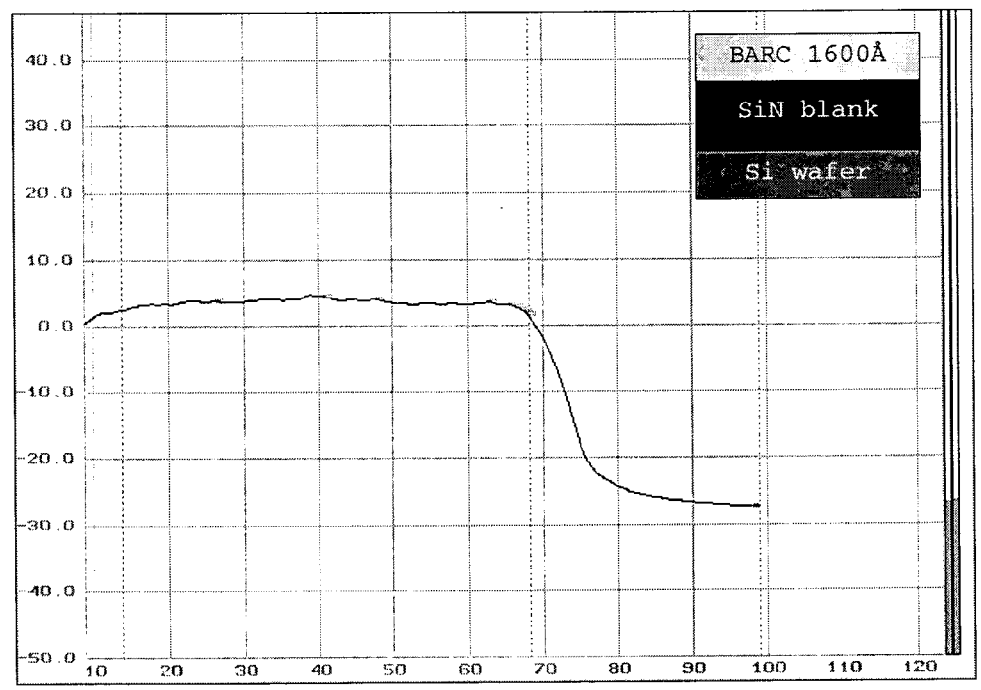
FIG. 8 is a graph plotting the EPD for BARC at 1600 Å over blank silicon nitride at 3095 Å.

In the first test etch, the test wafer comprises BARC a layer at a thickness of 1600 Å overlying silicon nitride film on a blank silicon wafer. The EPD graph, as shown in FIG. 8, clearly shows the EPD point being detected clearly over a high magnitude of endpoint signal.

Figure 9:
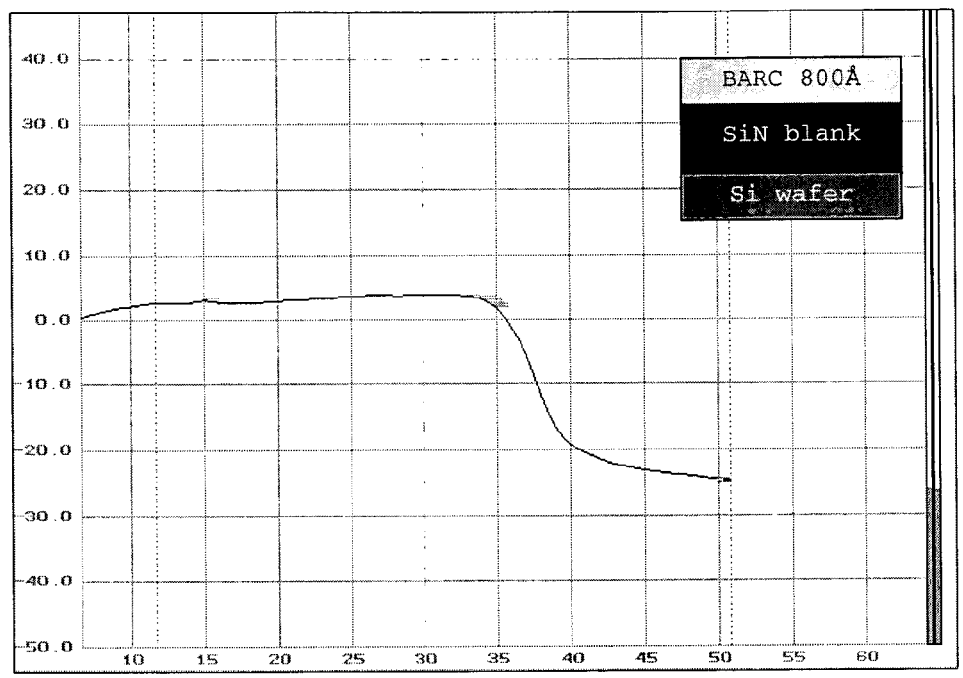
FIG. 9 is a graph plotting the EPD for BARC at 800 Å over blank silicon nitride at 3095 Å.

In the second test etch, the test wafer comprises a BARC layer at a thickness of 800 Å overlying silicon nitride film on a blank silicon wafer. The EPD graph, as shown in FIG. 9, also clearly shows the EPD point being detected clearly over a high magnitude of endpoint signal.

Figure 10:
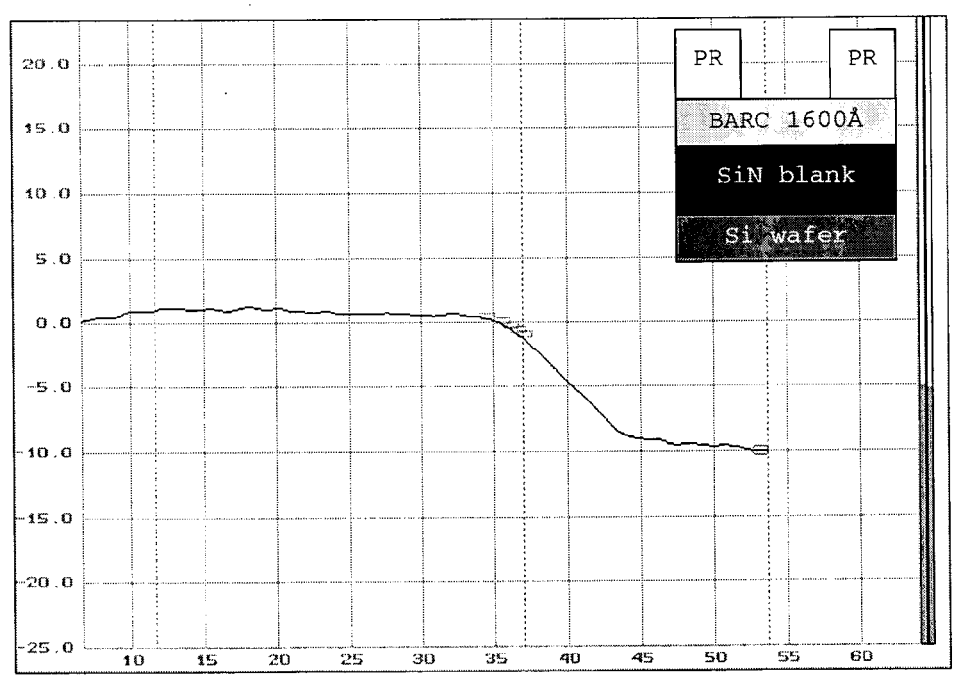
FIG. 10 is a graph plotting the EPD for BARC at 800 Å over patterned silicon nitride at 3095 Å.

In the third test etch, the test wafer comprises a BARC layer at a thickness of 800 Å overlying silicon nitride film on a silicon wafer which is patterned with photoresist (PR). The EPD graph, as shown in FIG. 10, again clearly shows the EPD point being detected clearly with the endpoint signal at a high magnitude.

The method of the present invention may be implemented in an etching chamber, including a DPS chamber wherein the optical endpoint system includes a plasma-etch optical emission-sensing with control means, i.e. for stopping the etch upon detecting endpoint with the present method. The method may also be implemented with an endpoint system which is enabled to define etch-endpoint algorithms for each wafer to be etched, control the point at which etching stops and store the endpoint data for each etched wafer, and wherein the endpoint data trace is retrievable for any etch operation subsequently.

Using the method of the invention, it may be possible to remove an overlying material by etching and monitoring it with an EPD system including other semiconductor fabrication processes such as planarization, and not just limited to the present etching of patterned wafers. The usefulness of the invention is applicable to any layers of film on a semiconductor wafer which have similar or very close EP emission wavelengths.

It is also possible to implement the invention in an etching process whereby the best range of EPD data has been previously obtained and stored, and now retrieved for the patterned etch. The invention may also be implemented in a process wherein the calibration steps of etching the blank wafers of the two materials are conducted in separate DPS chambers which are provided with online data transmission and control signal which may be fed to a processor, with or without memory to manage the data input to be processed and optionally provided with data storage and retrieval means so that the calibration etching and patterned etching may be performed online.

Such extrapolated applications, which may require some engineering assembly and arrangement but with no inventive step, are what a skill person would be able to achieve without departing from the letter and scope of the present invention.

The invention claimed is:

1. A method of determining the endpoint of an etch layer in a semiconductor element fabrication, wherein said element is comprised of at least a first material layer, a second material layer on said first material layer, said endpoint determining method comprises the steps of:
   (i) determining the total emission intensity wavelength of the first material layer;
   (ii) determining the total emission intensity wavelength of the second material layer;
   (iii) plotting the scalar of the wavelength differential of the first and second material layers;
   (iv) choosing the highest peak of wavelength differential as the best range of endpoint detection wavelength;
   wherein steps (i) and (ii) are conducted with a recipe which is effective in etching said second material layer;
   wherein the first material is nitrogen-rich silicon material has the general empirical formula $Si_xN_y$, including silicon nitride, $Si_3N_4$ (hereinafter "SiN"), and the anti-reflective coating (ARC) layer is a bottom reflective coating (BARC), including organic and inorganic BARC materials;
   wherein the recipe includes a plasma etching environment having low source power, low bias power, low pressure and etch chemistries including $Cl_2$ and $O_2$; and
   wherein the plasma is a decoupled plasma source (DPS) having a pressure at about 0.8 Pa (6 mTorr), bias power at about 55 W, source power at about 350 W, $Cl_2$ flow rate at about 47 sccm and $O_2$ flow rate of 47 sccm.

2. A process for etching an upper layer from a lower layer in the fabrication of a semiconductor element, comprising the steps of:
   (i) determining the total emission intensity wavelength of the upper layer;
   (ii) determining the total emission intensity wavelength of the lower layer;
   (iii) plotting the scalar of the wavelength differential of the upper and lower layers;
   (iv) choosing the highest peak of the differential graph as the best range of endpoint detection wavelength;
   (v) etching said upper layer using the wavelength chosen according to step (iv) as endpoint detection;
   wherein the steps of (i) and (ii) are conducted with a recipe which is effective in etching said upper material layer;
   wherein the recipe includes plasma-etching environment having low source power, low bias power, low pressure and etch chemistries including $Cl_2$ and $O_2$; and
   wherein the plasma is a decoupled plasma source (DPS) having a pressure at about 0.8 Pa (6 mTorr), bias power at about 55 W, source power at about 350 W, $Cl_2$ flow rate at about 47 sccm and $O_2$ flow rate of 47 sccm.

3. A process for etching an upper layer from a lower layer in the fabrication of a semiconductor element, comprising the steps of:
   (i) determining the total emission intensity wavelength of the upper layer;
   (ii) determining the total emission intensity wavelength of the lower layer;

(iii) plotting the scalar of the wavelength differential of the upper and lower layers;

(iv) choosing the highest peak of the differential graph as the best range of endpoint detection wavelength;

(v) etching said upper layer using the wavelength chosen according to step (iv) as endpoint detection; and wherein the etching is conducted in an environment comprising a source power of about 250–450 W, a bias power of about 40–70 W, a pressure of about 0.53–1.1 Pa (4–8 mTorr) and a ratio of $Cl_2$ flow to $O_2$ flow of about 0.75–1.25.

4. A process for etching an upper layer from a lower layer in the fabrication of a semiconductor element, comprising the steps of:

(i) determining the total emission intensity wavelength of the upper layer;

(ii) determining the total emission intensity wavelength of the lower layer;

(iii) plotting the scalar of the wavelength differential of the upper and lower layers;

(iv) choosing the highest peak of the differential graph as the best range of endpoint detection wavelength;

(v) etching said upper layer using the wavelength chosen according to step (iv) as endpoint detection;

wherein step (i) is conducted in a first etching chamber, including a DPS chamber, provided with online data transmission and control signal;

wherein step (ii) is conducted in a second etching chamber, including a DPS chamber, provided with online data transmission and control signal; and wherein at least a processor, memory and optionally data storage means are provided in a suitable arrangement to perform steps (iii) and (iv) with the inputs from the first and second etching chambers.

5. A process for etching an upper layer from a lower layer in the fabrication of a semiconductor element, comprising the steps of:

(i) determining the total emission intensity wavelength of the upper layer, wherein the determination is conducted in a first etching chamber, including a DPS chamber, provided with online data transmission and control signal;

(ii) determining the total emission intensity wavelength of the lower layer, wherein the determination is conducted in a second etching chamber, including a DPS chamber, provided with online data transmission and control signal;

(iii) plotting the scalar of the wavelength differential of the upper and lower layers;

(iv) choosing the highest peak of the differential graph as the best range of endpoint detection wavelength; wherein at least a processor, memory and optionally data storage means are provided in a suitable arrangement to perform steps (iii) and (iv) with the inputs from the first and second etching chambers; and (v) etching said upper layer using the wavelength chosen according to step (iv) as endpoint detection, wherein the etching of said upper layer is conducted in a third etching chamber, including a DPS chamber, upon determining the best wavelength in step (iv) as endpoint detection.

* * * * *

UNITED STATES PATENT AND TRADEMARK OFFICE
CERTIFICATE OF CORRECTION

PATENT NO. : 7,045,467 B2  
APPLICATION NO. : 10/607942  
DATED : May 16, 2006  
INVENTOR(S) : Huong Page 1 of 1

It is certified that error appears in the above-identified patent and that said Letters Patent is hereby corrected as shown below:

Title Page, No. (73) delete "Bnd" and substitute therefor -- Bhd --

Signed and Sealed this

Second Day of January, 2007

JON W. DUDAS  
*Director of the United States Patent and Trademark Office*